United States Patent
Nishi et al.

(10) Patent No.: US 10,487,013 B2
(45) Date of Patent: Nov. 26, 2019

(54) CERAMIC RESIN COMPOSITE BODY

(71) Applicant: Denka Company Limited, Tokyo (JP)

(72) Inventors: Taiki Nishi, Shibukawa (JP); Hideki Hirotsuru, Tokyo (JP); Toshikatsu Mitsunaga, Fukuoka (JP); Saori Inoue, Fukuoka (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 16/083,035

(22) PCT Filed: Mar. 10, 2017

(86) PCT No.: PCT/JP2017/009791
§ 371 (c)(1),
(2) Date: Sep. 7, 2018

(87) PCT Pub. No.: WO2017/155110
PCT Pub. Date: Sep. 14, 2017

(65) Prior Publication Data
US 2019/0092695 A1    Mar. 28, 2019

(30) Foreign Application Priority Data

Mar. 10, 2016    (JP) .................................. 2016-047255

(51) Int. Cl.
| H05K 1/03 | (2006.01) |
| C04B 35/584 | (2006.01) |
| C04B 35/581 | (2006.01) |
| C04B 35/583 | (2006.01) |
| C04B 35/634 | (2006.01) |

(52) U.S. Cl.
CPC .......... *C04B 35/584* (2013.01); *C04B 35/581* (2013.01); *C04B 35/583* (2013.01); *C04B 35/63448* (2013.01); *H05K 1/0346* (2013.01); *C04B 2235/48* (2013.01); *C04B 2235/524* (2013.01); *C04B 2235/5436* (2013.01)

(58) Field of Classification Search
CPC .... H05K 1/0373; H05K 1/0353; H05K 1/036; H05K 1/0366
See application file for complete search history.

(56) References Cited

U.S. PATENT DOCUMENTS

| 5,925,451 A | 7/1999 | Ohya et al. |
| 6,093,476 A | 7/2000 | Horiuchi et al. |

| 2012/0211773 A1* | 8/2012 | Fleming ................. H01L 23/60 |
| | | 257/88 |
| 2016/0227644 A1 | 8/2016 | Hirotsuru et al. |
| 2017/0036963 A1 | 2/2017 | Ikarashi et al. |
| 2017/0238418 A1* | 8/2017 | Kobayashi .............. B32B 15/08 |
| | | 428/209 |

FOREIGN PATENT DOCUMENTS

| JP | 62-126694 | 6/1987 |
| JP | 8-244163 | 9/1996 |
| JP | 10-100320 | 4/1998 |
| JP | 10-308565 | 11/1998 |
| JP | 2006-063315 A | 3/2006 |
| JP | 2009-049062 A | 3/2009 |
| JP | 2011-184507 A | 9/2011 |
| JP | 2014-189701 A | 10/2014 |
| JP | 2014-196403 A | 10/2014 |
| JP | 2015-124122 A | 7/2015 |
| JP | 2016-111171 A | 6/2016 |
| WO | WO-2014/196496 A1 | 12/2014 |
| WO | WO-2015/022956 A1 | 2/2015 |

OTHER PUBLICATIONS

Search Report in International Application No. PCT/JP2017/009791 dated May 23, 2017, 4 pages.
International Preliminary Report on Patentability and Written Opinion in International Application No. PCT/JP2017/009791 dated Sep. 20, 2018, 6 pages.

* cited by examiner

*Primary Examiner* — Jeremy C Norris
(74) *Attorney, Agent, or Firm* — Marshall, Gerstein & Borun LLP

(57) ABSTRACT

Provided is a ceramic-resin composite body that has good mass productivity and product properties (heat dissipation properties, insulation properties and adhesive properties), and particularly a ceramic-resin composite that can dramatically improve the heat dissipation properties for electronic devices. The ceramic-resin composite body includes: 35 to 70% by volume of a sintered body having a monolithic structure in which non-oxide ceramic primary particles having an average major diameter of from 3 to 60 μm and an aspect ratio of from 5 to 30 are three-dimensionally continuous; and 65 to 30% by volume of a thermosetting resin composition having an exothermic onset temperature of 180° C. or more and a curing rate of from 5 to 60% as determined with a differential scanning calorimeter, and having a number average molecular weight of from 450 to 4800, wherein the sintered body is impregnated with the thermosetting resin composition.

10 Claims, No Drawings

CERAMIC RESIN COMPOSITE BODY

TECHNICAL FIELD

The present invention relates to a ceramic-resin composite body and a thermally conductive insulating adhesive sheet using the same.

BACKGROUND ART

Recently, mounting technologies have drastically advanced in each class of semiconductor devices, printed wiring board mounting and device mounting, in association with improved performance and miniaturization of electronic devices typified by mobile phones, LED lighting devices, in-car power modules and the like. For this reason, heat generation density inside the electronic devices has been increased year after year, and there is an important issue of how to efficiently dissipate heat generated during use. Therefore, a thermally conductive insulating adhesive sheet for fixing electronic members has required an unconventional higher thermal conductivity, in addition to insulating properties and adhesiveness.

Conventionally, the above thermally conductive insulating adhesive sheet has employed a thermosetting resin composition obtained by dispersing ceramics powder having high thermal conductivity, such as aluminum oxide, silicon nitride, boron nitride, aluminum nitride or the like, in a thermosetting resin in an uncured state (A stage), and then forming the dispersion by coating or the like with various coaters into a sheet, and then heating it to render the thermosetting resin a semi-cured state (B stage).

The thermally conductive insulating adhesive sheet allows strong adhesion to an electronic member such as a metal circuit or a metal plate by bringing the thermally conductive insulating adhesion sheet into close contact with the electronic member, and then heating the sheet to melt the thermosetting resin in the semi-cured state (B stage) and infiltrating the molten resin into irregularities on the surface of the electronic member to develop adhesiveness of the thermally conductive insulating adhesive sheet to the electronic member, and further heating the thermosetting resin to render it a completely cured state (C stage).

The thermally conductive insulating adhesive sheet as described above does not require formation of an adhesive layer (the thermosetting resin in the uncured state (A stage) or a dispersion of ceramics powder in the thermosetting resin in the uncured state (A stage)) between the sheet and the electronic member such as a metal circuit and a meal plate. Therefore, the sheet has been widely used because it does not require a coating operation or introduction of a precise coating device, so that operation by a user is very simple.

Patent Document 1 discloses a simple method for obtaining a metal-based circuit board having good heat dissipation, by curing the thermosetting resin contained in the thermally conductive insulating adhesive sheet to render the resin the C stage, while disposing a metal foil on the thermally conductive insulating adhesive sheet having the ceramic powder dispersed in the thermosetting resin in the semi-cured state (B stage).

A method for increasing a thermal conductivity of the thermally conductive insulating adhesive sheet as described above includes: (1) increasing a thermal conductivity of the thermosetting resin in the completely cured state (C stage); (2) increasing a thermal conductivity of the ceramic powder; (3) increasing a particle size of the ceramic powder; and (4) highly filling the ceramic powder. Patent Document 2 can obtain the thermally conductive insulating adhesive sheet having high thermal conductivity by the above method (1). Patent Document 3 can obtain the thermally conductive insulating adhesive sheet having high thermal conductivity by the above method (2) using boron nitride having high thermal conductivity as the ceramic powder. Further, Patent Document 4 can obtain the thermally conductive insulating adhesive sheet having high thermal conductivity by the above methods (2) and (4). Furthermore, Patent Document 5 can obtain the thermally conductive insulating adhesive sheet having high thermal conductivity by combining aluminum nitride powders having various particle sizes at a specific ratio and by the above methods (2), (3) and (4).

However, in the inventions described in Patent Documents 1 and 3 to 5, the thermosetting resin layer having low thermal conductivity is present among the respective particles of the ceramic powder, so that the thermal conductivity is at most 16 W/(m·K) (see Synthesis Example 7 in Table 2 in Patent Document 5), and there is a limit for obtaining high thermal conductivity. Patent Document 2 also has a limit for increasing the thermal conductivity of the thermosetting resin, and exhibits a thermal conductivity of at most 10.5 W/(m·K) (see Example 6 in Patent Document 2). Therefore, there has been a problem in terms of heat dissipation, for thermal design requirements of electronic devices, which have become increasingly severe in recent years.

Thus, Patent Documents 6 to 9 each proposes a ceramic-resin composite body obtained by sintering ceramic primary particles having high thermal conductivity to form a ceramic sintered body having a monolithic structure that is three-dimensionally continuous, then filling pores of the ceramic sintered body with a thermosetting resin to form a ceramic-resin composite body, and then processing the ceramic-resin composite body into a plate shape. According to these inventions, the thermal conductivity of the plate-shaped ceramic-resin composite body (a thermally conductive insulating adhesive sheet) is dependent on the ceramic sintered body, so that the high thermal conductivity can be obtained.

CITATION LIST

Patent Literatures

Patent Document 1: Japanese Patent Application Publication No. 2009-49062 A
Patent Document 2: Japanese Patent Application Publication No. 2006-63315 A
Patent Document 3: Japanese Patent Application Publication No. 2014-196403 A
Patent Document 4: Japanese Patent Application Publication No. 2011-184507 A
Patent Document 5: Japanese Patent Application Publication No. 2014-189701 A
Patent Document 6: Japanese Patent Application Publication No. S62-126694 A
Patent Document 7: WO 2014/196496 A1
Patent Document 8: WO 2015/022956 A1
Patent Document 9: Japanese Patent Application Publication No. H08-244163 A

SUMMARY OF INVENTION

Technical Problem

However, when two or more plate-shaped ceramic resin composite bodies are laminated according to the invention described in Patent Document 6, an adhesive layer having low thermal conductivity (the thermosetting resin or a dispersion of ceramic powder in the thermosetting resin) is required between the plate-shaped ceramic-resin composite bodies (see FIG. 4 in Patent Document 6), which causes a problem in terms of heat dissipation.

Patent Document 7 also requires an adhesive layer having low thermal conductivity (the thermosetting resin or the dispersion of ceramic powder in the thermosetting resin) when bonding the plate-shaped ceramic-resin composite body to an electronic member such as a metal circuit or a metal plate, which causes a problem in terms of heat dissipation.

Patent Document 8 also requires an adhesive layer having low thermal conductivity (the thermosetting resin or the dispersion of ceramic powder in the thermosetting resin; see paragraphs [0056] and [0057] in Patent Document 8) when bonding the plate-shaped ceramic-resin composition body to a metal circuit and a metal plate. Therefore, the thermal resistance of the adhesive layer between the metal circuit and the plate-shaped ceramic-resin composite body is increased, which causes a problem of heat dissipation.

Patent Document 9 proposes the plate-shaped ceramic-resin composite body (the thermally conductive insulating adhesive sheet) having an adhesive function, and enables a circuit board having improved heat dissipation properties to be obtained. However, according to Patent Document 9, the state of curing of the thermosetting resin before being bonded to the metal circuit is in an uncured state (A stage) (see paragraph 0053 in Patent Document 9). If the state of curing of the thermosetting resin contained in the ceramic-resin composite body is in the uncured state (A stage), the thermosetting resin in the uncured state will melt by heat generated when the ceramic-resin composite body is cut into a plate-shaped thermally conductive insulating adhesive sheet, and variations of thickness will be generated, so that a desired thermally conductive insulating adhesive sheet cannot be obtained. Furthermore, the thermally conductive insulating adhesive sheet cannot withstand the impact of cutting, resulting in cracking. Therefore, to reinforce the ceramic sintered body in the cutting step it is necessary to impregnate the ceramic sintered body with a liquid organic material such as TMP (trimethylolpropane) or the like, and then cut the ceramic sintered body into the plate shape, removing the liquid organic material by a heat treatment or the like, and then impregnating the ceramic sintered body with a thermosetting resin to obtain the thermally conductive insulating adhesive sheet. This causes complicated processes (two impregnation steps are required (impregnation with the liquid organic substance and impregnation with the thermosetting resin) and each ceramic sintered body in the form of plate requires the impregnation with thermosetting resin, leading to a large amount of treatment), resulting in the increase in cost. These problems would become obstacles to mass production (see paragraphs [0036] to [0045] in Patent Document 9). Further, since the state of curing of the thermosetting resin contained in the thin thermally conductive insulating adhesive sheet is in the uncured state (A stage), the reinforcing effect is small and cracks are liable to occur when bonding the metal circuit (see paragraph [0063] in Patent Document 9), and it is difficult to obtain desired characteristics due to deterioration of insulation. Furthermore, there is also a problem that when the thermosetting resin is in the uncured state (A stage) in which fluidity is too high, a thermosetting resin layer having low thermal conductivity is formed on the irregularities of the surface of the electronic member, which results in a decrease in the thermal conductivity.

Although the ceramic sintered body has high thermal conductivity as a substance because the ceramic sintered body generally has high elastic modulus, the ceramic sintered body contained in the thermally conductive insulating adhesive sheet is difficult to follow irregularities on the surface of the electronic member such as a metal circuit and a metal plate when the electronic member is bonded to the thermally conductive insulating adhesive sheet by heating and pressurizing, so that the ceramic sintered body does not exhibit high thermal conductivity. Further, even if a ceramic sintered body having low elastic modulus is used, the ceramic sintered body does not exhibit high thermal conductivity either, when the thermosetting resin contained in the thermally conductive insulating adhesive sheet is in the fully cured state (C stage) that has low fluidity, because the ceramic sintered body and the thermosetting resin are difficult to infiltrate into irregularities on the surface of the electronic member. Furthermore, if the thermosetting resin contained in the thermally conductive insulating adhesive sheet is in the uncured state (A stage) in which the fluidity of the thermosetting resin is too high (viscosity is too low), problems tend to occur in the cutting step and the bonding step, complicated processes or a decrease in properties such as insulating properties may happen. No techniques comprehensively focusing on these findings have been found so far.

In view of the background art as described above, one of objects of the present invention is to provide a ceramic-resin composite body that has good mass productivity and product properties (heat dissipation properties, insulation properties and adhesive properties), and in particular that can dramatically improve the heat dissipation properties for electronic devices. Another object of the present invention is to provide a thermally conductive insulating adhesive sheet made of the ceramic-resin composite according to the present invention.

Solution to Problem

In one aspect, the present invention relates a ceramic-resin composite body comprising: from 35% to 70% by volume of a sintered body having a monolithic structure in which non-oxide ceramic primary particles having an average major diameter of from 3 to 60 μm and an aspect ratio of from 5 to 30 are three-dimensionally continuous; and from 65 to 30% by volume of a thermosetting resin composition having an exothermic onset temperature of 180° C. or more and a curing rate of from 5% to 60% as determined with a differential scanning calorimeter, and having a number average molecular weight of from 450 to 4800, wherein the sintered body is impregnated with the thermosetting resin composition.

In one embodiment of the ceramic-resin composite body according to the present invention, the non-oxide ceramic sintered body comprises one or a combination of two or more selected from the group consisting of boron nitride, aluminum nitride and silicon nitride.

In another embodiment of the ceramic-resin composite body according to the present invention, the thermosetting resin composition has a melting temperature of 70° C. or more.

In yet another embodiment of the ceramic-resin composite body according to the present invention, the thermosetting resin composition comprises a combination of one or both of a substance having at least one epoxy group and a substance having at least one cyanate group with one or both of a substance having at least one hydroxyl group and a substance having at least one maleimide group.

In another aspect, the present invention relates to a thermally conductive insulating adhesive sheet obtained by processing the ceramic-resin composite according to the present invention.

In yet another aspect, the present invention relates to a circuit board comprising a metal circuit laminated on a metal plate via an insulating layer, wherein the thermally conductive insulating adhesive sheet according to the present invention is used for the insulating layer.

In another aspect, the present invention relates to a multilayer circuit board comprising two or more layers of insulating layers and metal circuits alternately laminated on a metal plate, wherein the thermally conductive insulating adhesive sheet according to the present invention is used for the insulating layers.

In another aspect, the present invention relates to an in-car power module structure comprising two or more electronic members bonded via the thermally conductive insulating adhesive sheet according to the present invention.

In another aspect, the present invention relates to a light emitting device comprising: the circuit board or the multilayer circuit board according to the present invention; and at least one LED provided on a metal circuit.

Advantageous Effects of Invention

The thermally conductive insulating adhesive sheet obtained by processing the ceramic-resin composite body according to the present invention has improved insulating properties and adhesiveness, and exhibits high thermal conductivity. Therefore, electronic devices using the thermally conductive insulating adhesive sheet of the present invention exhibits improved reliability and heat dissipation properties.

DESCRIPTION OF THE PREFERRED EMBODIMENTS

One of features of the present invention is that unprecedented high thermal conductivity is achieved together with improved mass productivity, insulation properties and adhesiveness by impregnating a non-oxide ceramic sintered body controlled within a specific physical property range with an appropriate amount of each material of a thermosetting resin composition in B stage, having a predetermined exothermic onset temperature, a curing rate and a number average molecular weight. While not wishing to be bound by any theory, it is believed that the high thermal conductivity is achieved because the non-oxide ceramic sintered body and the thermosetting resin simultaneously infiltrate into irregularities on the surface of the electronic member such as a metal circuit and a metal plate. Such a high thermal conductivity cannot be achieved by a conventional common combination of a ceramic sintered body and a thermosetting resin composition, and can be provided for the first time by the present invention. That is, the present inventors have developed an epoch-making thermally conductive insulating adhesive sheet which could not be anticipated from the prior arts. Each material to be used will be described below.
<Non-Oxide Ceramic Sintered Body, Ceramic-Resin Composite, Thermally Conductive Insulating Adhesive Sheet, Insulating Layer>

As used herein, a state where two or more non-oxide ceramic primary particles are bonded together by sintering and agglomerated is defined as a "non-oxide ceramic sintered body" having a three-dimensionally continuous monolithic structure. As used herein, a composite comprised of the non-oxide ceramic sintered body and a thermosetting resin composition is defined as a "ceramic-resin composite body". Further, a ceramic-resin composite body processed into a sheet shape is defined as a "thermally conductive insulating adhesive sheet". The thermally conductive insulating adhesive sheet in a C stage state after the thermally conductive insulating adhesive sheet has adhered to an electronic member such as a metal circuit or a metal plate by a heat pressing or the like and curing of the thermosetting resin composition has almost finished is defined as an "insulating layer".

The bonding of the non-oxide ceramic primary particles by sintering can be evaluated by observing bonded portions of the non-oxide ceramic primary particles in the cross section of the non-oxide ceramic primary particles using a scanning electron microscope (for example, "JSM-6010LA" available from JEOL Ltd.). As a pretreatment for observation, the non-oxide ceramic sintered body is embedded with a resin, and then processed by a CP (cross section polisher) method, fixed on a sample stage, and then coated with osmium. The observation is carried out at 1500 magnifications. Further, the non-oxide ceramic sintered body for evaluation can be obtained by incinerating the thermosetting resin composition forming the ceramic-resin composite at a temperature of from 500 to 900° C. in the atmosphere. When there is no bonding of the non-oxide ceramic primary particles by sintering, its shape cannot be maintained during the incinerating.
<Electronic Member>

As used herein, an "electronic member" refers to a member to be bonded to the thermally conductive insulating adhesive sheet, in particular a member made of a metal or a metal-based composite material such as metal circuits, metal plates and coolers made of aluminum.
<Average Major Diameter>

The non-oxide ceramic primary particles in the non-oxide ceramic sintered body is required to have an average major diameter of from 3 to 60 μm, and preferably an average major diameter in a range of from 5 to 50 μm, and more preferably in a range of from 10 to 40 μm, and even more preferably in a range of from 15 to 35 μm. An average major diameter of less than 3 μm will lead to an increased elastic modulus of the non-oxide ceramic sintered body, so that when the electronic member such as the metal plate and the metal circuit is bonded to the thermally conductive insulating adhesive by means of heating and pressurizing, the non-oxide ceramic sintered body contained in the thermally conductive insulating adhesive sheet is difficult to follow irregularities on the surface of the electronic member such as the metal plate and the meal circuit, whereby the heat conductivity and tensile shear adhesive strength may be decreased. An average major diameter of more than 60 μm will lead to decreased strength of the non-oxide ceramic sintered body, so that the insulating layer is easily broken. Therefore, it may result in a decreased tensile shear adhesive strength between the electronic member such as the metal plate and the metal circuit and the insulating layer.
<Definition and Evaluation Method of Average Major Diameter>

For a pretreatment for observation of the average major diameter, the non-oxide ceramic sintered body is embedded in a resin, processed by a CP (cross section polisher) method, fixed to a sample stage, and then coated with osmium. Subsequently, a SEM image is taken with a scanning electron microscope, for example, "JSM-6010LA" (available from JEOL Ltd.), and a particle image of the resulting cross section is taken in an image analysis software such as "A-Zou Kun" (available from Asahi Kasei Engineering Corporation) and measurement can be carried out. In Examples, the image was measured at 100 magnifications, and the image analysis was carried out at 15.1 million pixels. The major diameters of 100 arbitrary particles obtained were observed by manual measurement, and its average value was determined to be the average major diameter. As used herein, the "major diameter" of the non-oxide ceramic primary particle refers to a diameter of the smallest circle that can encompass the particle to be observed.

<Aspect Ratio>

The non-oxide ceramic primary particles of the present invention should have an aspect ratio of from 5 to 30, and preferably an aspect ratio in a range of from 7.5 to 20, and more preferably in a range of from 10 to 15. An aspect ratio of less than 5 will lead to an increased elastic modulus of the non-oxide ceramic sintered body, so that when the electronic member such as the metal plate and the metal circuit is bonded to the thermally conductive insulating adhesive by means of heating and pressurizing, it is difficult for the non-oxide ceramic sintered body contained in the thermally conductive insulating adhesive sheet to follow irregularities on the surface of the electronic member such as the metal plate and the meal circuit, whereby the heat conductivity and tensile shear adhesive strength may be decreased. In contrast, an aspect ratio of more than 30 will lead to decreased strength of the non-oxide ceramic sintered body, so that the insulating layer is easily broken. Therefore, it may result in a decreased tensile shear adhesive strength between the electronic member such as the metal plate and the metal circuit, and the insulating layer.

<Evaluation Method of Aspect Ratio>

For a pretreatment for observation of the aspect ratio, the non-oxide ceramic sintered body is embedded in a resin, processed by a CP (cross section polisher) method, fixed to a sample stage, and then coated with osmium. Subsequently, a SEM image is taken with a scanning electron microscope, for example, "JSM-6010LA" (available from JEOL Ltd.), and a particle image of the resulting cross section is taken in an image analysis software such as "A-Zou Kun" (available from Asahi Kasei Engineering Corporation) and measurement can be carried out. In Examples, the image was measured at 100 magnifications, and the image analysis was carried out at 15.1 million pixels. 100 arbitrary particles obtained are observed by manual measurement to measure lengths of a major diameter and a minor diameter of each particle, values for the respective particles are calculated in accordance with the equation: aspect ratio=major diameter/minor diameter, and an average value thereof is determined to be the aspect ratio. As used herein, the "minor diameter" of the non-oxide ceramic primary particle refers to a diameter of the largest circle that can be encompassed by the particle to be observed.

<Percentage of Non-Oxide Ceramic Sintered Body>

The content of the non-oxide ceramic sintered body in the ceramic-resin composite is within a range of from 35 to 70% by volume (the content of the thermosetting resin composition is from 65 to 30%), and more preferably from 40 to 65% by volume. If it is less than 35% by volume, the proportion of the thermosetting resin composition having low thermal conductivity will be increased, so that the thermal conductivity is decreased. If it is more than 70% by volume, it is difficult for the thermosetting resin composition to infiltrate irregularities on the surface of the electronic member when bonding the electronic member such as the metal plate or the metal circuit to the thermally conductive insulating adhesive sheet by means of heating and pressurizing, so that the tensile shear adhesive strength and thermal conductivity may be decreased. The percentage (% by volume) of the non-oxide ceramic sintered body in the ceramic-resin composite can be determined by measuring bulk density and true density of the non-oxide ceramic sintered body as shown below:

Bulk density ($D$) of non-oxide ceramic sintered body=mass/volume; (1)

Porosity (%) of non-oxide ceramic sintered body= (1−($D$/true density of non-oxide ceramic sintered body)×100=percentage (%) of thermosetting resin composition; and (2)

Percentage (%) of non-oxide ceramic sintered body=100−percentage of thermosetting resin composition. (3)

The bulk density of the non-oxide ceramic sintered body is determined from a volume calculated from a length of each edge of the non-oxide ceramic sintered body having a regular hexahedral shape (measured with a caliper) and a mass determined by an electronic balance according to the method of measuring the density and the specific gravity by geometrical measurement defined in JIS Z8807: 2012 (see Section 9 of JIS Z8807: 2012). The true density of the non-oxide ceramic sintered body is determined from a volume and a mass of the non-oxide ceramic sintered body determined using a dry automatic densitometer according to the method of measuring the density and the specific gravity by the gas substitution method defined in JIS Z8807: 2012 (see the equations (14)-(17) on Section 11 of JIS Z8807: 2012). Closed pores and open pores may be present in pores of an ordinary ceramic sintered body. However, in the non-oxide ceramic sintered body according the present invention, the presence of the closed pores can be ignored (1% or less) by controlling the average major diameter, the aspect ratio or the like of the non-oxide ceramic primary particles within the specific range.

Further, the average pore diameter is not particularly limited, but it is practically from 0.1 to 3.0 µm, in terms of impregnation properties or the like of the thermosetting resin composition. The average pore diameter is a pore diameter at which a cumulative value of the pore size volume is 50% of the whole (the cumulative pore volume value is the maximum value) when creating a cumulative pore size distribution curve (see Appendix FIG. 6 of JIS R1655: 2003) with a mercury porosimeter, in accordance with JIS R1655: 2003. The cumulative pore size distribution curve with the mercury porosimeter can be prepared using, for example, "PASCAL 140-440" (available from Fisons Instruments Inc.).

<Main Component of Non-Oxide Ceramic Sintered Body>

In view of use in a power module or the like which requires high reliability, the main component of the non-oxide ceramic sintered body that can be suitably used in the present invention is one or a combination of two or more selected from boron nitride, aluminum nitride and silicon nitride each having a thermal conductivity of at least 40 W/(m·K).

<Method for Producing Non-Oxide Ceramic Sintered Body>

The non-oxide ceramic sintered body can be produced such as by mixing from about 0.01 to 20% by mass, and typically about from 0.1 to 10% by mass, and more typically about from 1 to 5% by mass (internal percentage) of a sintering aid such as calcium carbonate, sodium carbonate and boric acid with boron nitride powder; forming the mixture by a known method such as a mold or a cold isostatic pressing method (CIP); and then sintering the formed body in a non-oxidizing atmosphere such as nitrogen and argon at a temperature of from 1500 to 2200° C. for about 1 to 30 hours. When using aluminum nitride or silicon nitride powder, it can also be produced by a similar method using a sintering aid such as yttria, alumina, magnesia and rare earth element oxide. Examples of a sintering furnace that can be used include a batch type furnace such as a muffle furnace, a tubular furnace and an atmosphere furnace, and a continuous type furnace such as a rotary kiln, a screw conveyor furnace, a tunnel furnace, a belt furnace, a pusher furnace and a vertical continuous furnace. These are selectively used depending on the purpose. For example, the batch type furnace is used when many types of non-oxide ceramic sintered bodies are produced in small quantity, and the continuous type furnace is used when a certain type of non-oxide ceramic sintered body is produced in large quantity.

<Formation of Composite of Non-Oxide Ceramic Sintered Body and Thermosetting Resin Composition>

The non-oxide ceramic sintered body and the thermosetting resin composition according to the present invention can be compounded by impregnating the non-oxide ceramic sintered body with the thermosetting resin composition, for instance. The Impregnation with the thermosetting resin composition can be carried out by vacuum impregnation, pressure impregnation at 1 to 300 MPa (G), or a combination thereof. The pressure during vacuum impregnation is preferably 1000 Pa (abs) or less, and more preferably 100 Pa (abs) or less. With the pressure impregnation, the inside of the non-oxide ceramic sintered body may not be sufficiently impregnated with the thermosetting resin composition when the pressure is less than 1 MPa (G), and larger scale equipment will be required if the pressure is higher than 300 MPa (G), which is disadvantage in terms of cost. To easily impregnate the inside of the non-oxide ceramic sintered body with the thermosetting resin composition, they are more preferably heated at a temperature of from 100 to 180° C. during vacuum impregnation and pressure impregnation to decrease viscosity of the thermosetting resin composition.

<Thermosetting Resin Composition>

The thermosetting resin composition is preferably a combination of one or both of a substance having at least one epoxy group and a substance having at least one cyanate group, with one or both of a substance having at least one hydroxyl group and a substance having at least one maleimide group. Examples of the substance having at least one epoxy group include epoxy resins such as bisphenol A type epoxy resins, bisphenol F type epoxy resins, multifunctional epoxy resins (novolac epoxy resins of cresol, dicyclopentadiene type epoxy resins, and the like), phenol novolac type epoxy resins, cycloaliphatic epoxy resins, glycidyl ester type epoxy resins and glycidyl amine type epoxy resins; examples of the substance having at least one cyanate group include cyanate resins such as 2,2'-bis(4-cyanatophenyl) propane, bis(4-cyanato-3,5-dimethylphenyl)methane, 2,2'-bis(4-cyanatophenyl)hexafluoropropane, 1,1'-bis(4-cyanatophenyl)ethane, and 1,3-bis[2-(4-cyanatophenyl)isopropyl)] benzene; examples of the substance having at least one hydroxyl group include phenols such as phenol novolac resins and 4,4'-(dimethylmethylene)bis[2-(2-propenyl)phenol]; examples of the substance having at least one maleimide group include maleimide resins such as 4,4'-diphenylmethane bismaleimide, m-phenylene bismaleimide, bisphenol A diphenylether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenylether bismaleimide, 4,4'-diphenylsulfone bismaleimide, 1,3-bis(3-maleimidophenoxy)benzene, 1,3-bis(4-maleimidophenoxy) benzene, bis(3-ethyl-5-methyl-4-maleimidophenyl) methane, and 2,2'-bis[4-(4-maleimidophenoxy)phenyl] propane.

The thermosetting resin composition may optionally contain a silane coupling agent for improving the adhesion between the non-oxide ceramic sintered body and the thermosetting resin composition; a defoaming agent, a surface conditioner, and a wetting dispersant, for promoting improvement of wettability or a leveling property and a decrease in viscosity to reduce generation of defects during impregnation and curing. Further, a curing accelerator may be added to control the curing rate and the exothermic onset temperature. Examples of the curing accelerator include imidazoles such as 2-ethyl-4-methylimidazole and 2-phenylimidazole; organic phosphorus compounds such as triphenylphosphine and tetraphenylphosphonium tetra-p-tolylborate; and metal catalysts such as acetylacetone copper (II), and zinc (II) acetylacetonate.

<Surface Treatment in Pore of Non-Oxide Ceramic Sintered Body>

The surfaces of the pores of the non-oxide ceramic sintered body may be subjected to a surface treatment for improving the adhesion between the non-oxide ceramic sintered body and the thermosetting resin composition. The surface treatment method can be carried out by impregnating the pores of the non-oxide ceramic sintered body with a silane coupling agent solution and then drying a solvent to remove it, before forming a composite of the sintered body and the thermosetting resin composition. The impregnation with the silane coupling agent solution can be carried out by vacuum impregnation, pressure impregnation under a pressure of from 1 to 300 MPa (G), or a combination thereof. Further, for the solvent, a known solvent such as water, alcohol, toluene or the like can be used alone or in combination. The functional groups of the silane coupling agent can be appropriately selected from those having reactivity with the functional group(s) of the thermosetting resin composition, and examples of the functional groups include an epoxy group, a cyanate group, an amino group and the like.

<Semi-curing of Thermosetting Resin Composition>

The thermosetting resin composition which has been compounded with the non-oxide ceramic sintered body can be semi-cured (rendered a B stage) to provide a ceramic-resin composite. The heating method that can be used includes infrared heating, hot air circulation, an oil heating method, a hot plate heating method or a combination thereof. The semi-curing may be carried out on the composite as it is by utilizing a heating function of the impregnation apparatus after completion of impregnation, or may be separately performed using a known apparatus such as a hot gas circulation type conveyor furnace after removing the composite from the impregnation apparatus.

<Exothermic Onset Temperature of Thermosetting Resin Composition>

The exothermic onset temperature of the thermosetting resin composition contained in the ceramic-resin composite, as measured with a differential scanning calorimeter, is preferably 180° C. or more, and more preferably 190° C. or more, and even more preferably 200° C. or more. If it is less than 180° C., the curing reaction of the thermosetting resin composition will proceed when the thermosetting resin composition is heated during vacuum impregnation and pressure impregnation, the viscosity of the thermosetting resin composition will be increased, so that the inside of each pore of the non-oxide ceramic sintered body cannot be impregnated with the thermosetting resin composition. As a result, defects (pores) will be present in the insulating layer of a circuit board, so that dielectric breakdown voltage is decreased. The upper limit is not particularly limited, but in view of productivity when an electronic member such as a metal plate or a metal circuit is bonded to the thermally conductive insulating adhesive sheet by heating and pressurizing and in view of heat resistance of a device component, the exothermic onset temperature is practically 300° C. or less. The exothermic onset temperature can be controlled by the curing accelerator or the like.

<Evaluation Method of Exothermic Onset Temperature of Thermosetting Resin Composition>

The exothermic onset temperature refers to a temperature at an intersection of a tangential line drawn from a maximum exothermic peak to a rise of an exothermic curve and a baseline, in the exothermic curve in which a temperature (° C.) is plotted in a horizontal axis and a heat flow (mW) is plotted in a vertical axis, which is obtained when the thermosetting resin composition is heated and cured with a differential scanning calorimeter.

<Curing Rate of Thermosetting Resin Composition>

The term "semi-cured (B stage) state" which indicates the state of curing of the thermosetting resin composition contained in the ceramic-resin composite body refers to a state where a curing rate obtained from the following calculation formula using differential scanning calorimetry is from 5 to 60%. If it is less than 5%, the thermosetting resin composition in an uncured state will melt due to heat when cutting the ceramic-resin composite body into a thermally conductive insulating adhesive sheet in the form of a plate, thereby causing variations in thickness. Further, the ceramic-resin composite body cannot withstand the impact of cutting, so that cracks are generated and the dielectric breakdown voltage of the circuit board is decreased. Furthermore, when an electronic member such as a metal plate or a metal circuit is bonded to the thermally conductive insulating adhesive sheet by heating and pressurizing, an adhesive (thermosetting resin composition) layer having low thermal conductivity is formed on irregularities on the surface of the electronic member such as the metal plate or the metal circuit, so that the thermal conductivity is decreased. If the curing rate is more than 60%, the thermosetting resin composition does not melt when bonding the electronic member such as the metal plate or the metal circuit to the thermally conductive insulating adhesive sheet by heating and pressurizing, and the electronic member such as the metal plate or the metal circuit cannot be bonded to the thermally conducting insulating adhesive sheet, so that a circuit board or the like cannot be manufactured. Therefore, when manufacturing the circuit board or the like, the adhesive layer having low thermal conductivity (the thermosetting resin composition or the dispersion of ceramic powder in the thermosetting resin composition) will be required when bonding the electronic member such as the metal plate or the metal circuit to the thermally conductive insulating adhesive sheet by heating and pressuring, so that the heat dissipation property of the circuit board or the like is decreased. The curing rate of the thermosetting resin composition in the ceramic-resin composite body is preferably from 10 to 50%, and more preferably from 12 to 40%, and still more preferably from 15 to 30%.

<Evaluation Method of Curing Ratio of Thermosetting Resin Composition>

Curing Rate (%)=$(X-Y)/X \times 100$ in which:

X is an amount of heat generated when the thermosetting resin composition in a state before proceeding with curing by heating is cured using a differential scanning calorimeter; and Y is an amount of heat generated when the thermosetting resin composition (the thermosetting resin composition to be evaluated for the curing rate) which has been in a semi-cured state (B stage) by heating is cured by using a differential scanning calorimeter.

It should be noted that the "cured" state in the above X and Y can be identified from the peaks of the resulting exothermic curve. Further, the "C stage state" refers to a state where the curing of the thermosetting resin composition is almost completed, and the thermosetting resin composition does not melt again even if it is heated at a high temperature. More particularly, it refers to a state where the curing rate defined in the paragraph regarding the "B stage state" is more than 60%. Furthermore, the "A stage state" refers to a state where little or no curing by heating progresses and the composition is in a state of liquid at normal temperature of 20° C. More particularly, it refers to a state where the curing rate defined in the paragraph regarding the "B stage state" is less than 5.0%.

<Number Average Molecular Weight and Evaluation Method of Thermosetting Resin Composition>

The number average molecular weight of the thermosetting resin composition contained in the ceramic-resin composite body according to the present invention is an average molecular weight expressed in terms of polystyrene, as determined with size exclusion chromatography (hereinafter, abbreviated as SEC) (in accordance with JIS K7252-1: 2016, Section 3.4.1, Formula (1)). The number average molecular weight is preferably in a range of from 450 to 4800, and more preferably in a range of from 500 to 4000, and still more preferably in a range of from 550 to 3500. If the number average molecular weight is less than 450, the thermosetting resin composition will melt due to the heat when cutting the ceramic-resin composite into a thermally conductive insulating adhesive sheet in the form of a plate, thereby causing variations in thickness. Further, the ceramic-resin composite cannot withstand the impact of cutting, so that cracks are generated. Furthermore, when an electronic member such as a metal plate or a metal circuit is bonded to the thermally conductive insulating adhesive sheet by heating and pressurizing, an adhesion layer (thermosetting resin composition) having low thermal conductivity will be formed on irregularities on the surface of the electronic member such as the metal plate or the metal circuit, so that the thermal conductivity is decreased. If the number average molecular weight is more than 4800, the melt viscosity of the thermosetting resin composition will be higher when bonding the electronic member such as the metal plate or the metal circuit to the thermally conductive insulating adhesive sheet by heat and pressurizing, so that the bonding strength to the electronic member is decreased. In addition, when the electronic member such as the metal plate or the metal circuit is bonded to the thermally conductive insulating adhesive sheet by heating and pressurizing, it is difficult for the non-oxide ceramic sintered body and the thermosetting resin composition to infiltrate irregularities on the surface of the electronic member such as the metal plate or metal circuit, so that the thermal conductivity is decreased.

<Melting Temperature and Evaluation Method of Thermosetting Resin Composition>

The melting temperature of the thermosetting resin composition contained in the ceramic-resin composite body according to the present invention is preferably 70° C. or more, and more preferably 80° C. or more, and still more preferably 95° C. or more. If the melting temperature is less than 70° C., the thermosetting resin composition will melt due to the heat when cutting the ceramic-resin composite into the thermally conductive insulating adhesive sheet in the form of a plate, thereby causing variations in thickness. The upper limit is not particularly limited. However, considering that when an electronic member such as a metal plate or a metal circuit is bonded to the thermally conductive insulating adhesive sheet by heating and pressurzing, an increase in viscosity of the thermosetting resin composition due to the progress of the curing reaction of the thermosetting resin composition should be suppressed, the melting temperature is practically 180° C. or less, and typically 150° C. or less, and more typically 120° C. or less. As used herein, the melting temperature refers to a temperature at the maximum endothermic peak when the thermosetting resin composition is heated by differential scanning calorimetry.

<Thickness of Thermally Conductive Insulating Adhesive Sheet>

The thickness of the thermally conductive insulating adhesive sheet can vary depending on required characteristics. For example, when withstand voltage is not so important and thermal resistance is important, a thinner sheet having a thickness of from 0.1 mm to 0.35 mm may be used. Conversely, when the withstand voltage and partial discharge characteristics are important, a thicker sheet having a thickness of from 0.35 mm to 1.0 mm may be used.

<Surface Treatment on Thermally Conductive Insulating Adhesive Sheet>

The surface of the thermally conductive insulating adhesive sheet may be subjected to a surface treatment for improving the adhesion between an insulating layer (the thermally conductive insulating adhesive sheet) and an electronic member such as a metal plate or a metal circuit. The surface treatment method can be carried out by applying a silane coupling agent solution onto the surface of the thermally conductive insulating adhesive sheet and then removing a solvent by drying or the like, prior to the bonding of the electronic member such as the metal plate or the metal circuit to the thermally conductive insulating adhesive sheet. Further, as the solvent, a known solvent such as water, alcohol, toluene or the like can be used alone or in combination. The functional groups of the silane coupling agent can be selected from those having reactivity with the functional group(s) of the thermosetting resin composition, as needed, and examples of the functional groups include an epoxy group, a cyanate group, an amino group and the like.

<Circuit Board>

The circuit board according to the present invention can be manufactured by laminating a metal circuit having a predetermined circuit pattern for mounting an electronic component onto the metal plate via the insulating layer.

<Multilayer Circuit Board>

The multilayer circuit board according to the present invention can be manufactured by alternately stacking two or more layers of the insulating layer and metal circuits on a metal plate. Electrical connection between the metal circuits can be carried out by a known method such as a combination of a drilling process using laser or drill, and a copper plating.

<In-Car Power Module>

The in-car power module structure according to the present invention can be manufactured by using the thermally conductive insulating adhesive sheet for bonding two or more electronic members. The two or more electronic members include one electrical member that is an aluminum cooler and the other electronic member that is a copper plate (heat dissipating plate) on a bottom surface of the power module, for example. In general, the TIM such as a heat dissipating sheet or the like is fixed with screws, so that heat from exothermic electronic components of the power module is released from a copper heat to the aluminum cooler through the heat dissipating sheet. However, since the thermally conductive insulating adhesive sheet has a high thermal conductivity, a high insulating property and an adhesive function in combination, the thermally conductive insulating adhesive sheet does not require screw fastening and is suitable as a structural member for the in-car power module structure.

<Light Emitting Device Having LED>

The light emitting device having LED(s) according to the present invention can be manufactured by bonding and mounting an LED element(s) with solder or the like on a metal circuit of the circuit board or the multilayer circuit board manufactured by using the thermally conductive insulating adhesive sheet as an insulating layer. Thus, the heat generated by the LED element(s) can be dissipated, so that an increase in the temperature of the LED element(s) can be suppressed and deterioration of the characteristics can be prevented.

<Power Module>

The circuit board or multilayer circuit board according to the present invention can be incorporated in the power module by bonding and mounting a power semiconductor element(s) on the metal circuit, with solder or the like. The elastic modulus of the non-oxide ceramic sintered body according to the present invention is lower by one or more digits than that of other ceramic sintered bodies such as an alumina substrate. Since the elastic modulus of the insulating layer is determined by the elastic modulus of the non-oxide ceramic sintered body, the elastic modulus of the insulating layer is also lower than that of the alumina substrate. Therefore, a thermal stress generated in a solder reflow or a heat cycle test will be lower than that of the alumina substrate, so that cracks generated in the solder or the like can be suppressed.

Further, because of the lower elastic modulus, warpage is extremely small even if the metal circuit and the metal plate have different thicknesses or different materials (for example, even if the metal plate is aluminum and the metal circuit is copper). Therefore, in contrast to other ceramic circuit boards such as alumina circuit boards, the circuit board or the multilayer circuit board according to the present invention enables to directly join the metal plate with a copper plate (the heat dissipating plate) on the bottom surface of the power module or an aluminum cooler without interposing the TIM (Thermal Interface Material) such as a solder and a heat dissipation grease, or enables to use the copper plate (the heat dissipating plate) on the bottom surface of the power module or the aluminum cooler in place of the metal plate. Accordingly, the circuit board or the multilayer circuit board according to the present invention is suitable as a structural member for the power module.

<Metal Circuit>

A material of the metal circuit may preferably be copper or aluminum in view of electrical conductivity and thermal conductivity. Taking only the characteristic aspect into consideration, silver, gold and the like may be used, but they are problematic in terms of cost, subsequent formation of the circuit and the like. The thickness of the metal circuit is preferably from 0.010 mm to 5.0 mm, and more preferably from 0.035 mm to 4.0 mm, and still more preferably from 0.105 mm to 2.0 mm. If the thickness is less than 0.010 mm, sufficient electric conductivity cannot be ensured when using the metal circuit as the circuit board or the multilayer circuit board, thereby causing a problem that the metal circuit portion generates heat, which is not preferable. If it is more than 5.0 mm, the thermal resistance of the metal circuit itself will be increased, so that the heat dissipation properties of the circuit board or the multilayer circuit board are deteriorated, which is not preferable.

<Metal Plate>

A material of the metal plate may preferably be copper or aluminum in view of electrical conductivity and cost. Taking only the characteristic aspect into consideration, silver, gold and the like may be used, but they are problematic in view of cost. The thickness of the metal plate is preferably from 0.070 mm to 5.0 mm, and more preferably from 0.3 mm to 4.0 mm, and still more preferably from 0.5 mm to 3.0 mm. If the thickness is less than 0.070 mm, the strength of the circuit board will be lowered, so that unwanted cracking, chipping, warpage or the like tends to occur in the mounting step of electronic components. If it is more than 5.0 mm, the thermal resistance of the metal plate itself will be increased, so that the heat dissipation properties of the circuit board are undesirably deteriorated, which is not preferable.

<Adhesive Surface Between Metal Plate and Metal Circuit>

To improve the adhesion of the insulating layer (the thermally conductive insulating adhesive sheet) to the metal plate and the metal circuit, the bonding surface of the metal plate and the metal circuit to the insulating layer (the thermally conductive insulating adhesive sheet) is preferably subjected to a surface treatment such as a degreasing treatment, sandblasting, etching, various plating treatments, a primer treatment using a silane coupling agent, and the like. Further, a surface roughness of the bonding surface of the metal plate and the metal circuit to the thermally conductive insulating adhesive sheet is preferably from 0.1 µm to 15 µm, and more preferably from 0.5 µm to 12 µm, and still more preferably 1.0 µm to 10 µm, in a ten point average roughness (Rz, JIS B0601: 1994). If the surface roughness is less than 0.1 µm, it will be difficult to ensure adequate adhesion to the thermally conductive insulating adhesive sheet. If it is more than 15 µm, defects will tend to occur at the bonding interface, so that the withstand voltage may be decreased or the adhesiveness may be decreased. The ten-point average roughness Rz can be determined using a contact type surface roughness measuring instrument, for example, "SEF 580-G18" (available from Kosaka Laboratory Ltd.).

<Adhesion Method of Metal Plate and Metal Circuit>

The metal plate and the metal circuit are bonded to the insulating layer (the thermally conductive insulating adhesive sheet) using a known method such as heat pressing or vacuum lamination pressing after lamination of each material.

<Method for Forming Metal Circuit>

A method for forming a predetermined circuit pattern of the metal circuit includes: (1) a method for forming a metal circuit by bonding a metal plate to the thermally conductive insulating adhesive sheet, forming an etching resist having a circuit pattern shape on the surface of the metal plate, removing an unnecessary metal portion through an etching process using an aqueous solution of cupric chloride or the like, and then peeling the etching resist with an aqueous alkali solution or the like; (2) a method of preliminarily pressing or etching the metal plate to form a metal circuit having a predetermined circuit pattern and then bonding the metal circuit to the thermally conductive insulating adhesive sheet. Ni plating or Ni alloy plating may be applied on the metal circuit as needed after forming the circuit pattern. Further, a solder resist may be formed on the metal circuit and the insulating layer, as needed.

EXAMPLES

Hereinafter, the present invention will be described in more detail by way of Examples and Comparative Examples, but these are provided for better understanding of the present invention and its advantages, and they are not intended to limit the present invention thereto.

Examples 1 to 12, Comparative Examples 1 to 13

<Preparation of Non-Oxide Ceramic Sintered Body>

Each non-oxide ceramic powder and each sintering aid as shown in Table 1 were mixed at a predetermined ratio as shown in Table 1. In Table 1, the particle diameter of the non-oxide ceramic powder refers to an average particle diameter. The non-oxide ceramic powder and the sintering aid were mixed in a wet ball mill using ethanol and silicon nitride balls for 2 hours, and then dried and disintegrated to obtain mixed powder. The mixed powder for molding was press-molded into a block using a mold under a pressure of 5 MPa. The resulting block molded bodies were treated with a CIP (cold isostatic pressing) apparatus ("ADW 800" available from KOBE STEEL LTD.) under a pressure of from 10 to 120 MPa (G), and then sintered in a batch type high frequency furnace ("FTH-300-1H" available from Fujidempa Kogyo Co., Ltd.) under the conditions as shown in Table 1 to obtain 15 non-oxide ceramic sintered bodies A to O.

(Average Pore Diameter)

The average pore diameter of each of the resulting non-oxide ceramic sintered bodies was determined by creating a cumulative pore size distribution curve by a mercury porosimeter ("PASCAL 140-440" available from by Fisons Instruments Inc.) according to the method as described above. The results are shown in Tables 4 and 5.

(Average Major Diameter and Aspect Ratio of Non-Oxide Ceramic Primary Particles in Non-Oxide Ceramic Sintered Body)

The average major diameter and the aspect ratio of the non-oxide ceramic primary particles in each of the resulting non-oxide ceramic sintered bodies were determined by taking a SEM image with a scanning electron microscope ("JSM-6010LA" available from JEOL Ltd.), and taking particle images of the resulting cross section in an image analysis software ("A-ZOU KUN" available from Asahi Kasei Engineering Co., Ltd.) and performing the measurement, in accordance with the method as described above. The results are shown in Tables 4 and 5.

TABLE 1

| Non-oxide Ceramic Sintered Body | Non-oxide Ceramic Powder (1) | | | Non-oxide Ceramic Powder (2) | | |
|---|---|---|---|---|---|---|
| | Type | Particle Diameter (μm) | Mixed Amount (% by mass) | Type | Particle Diameter (μm) | Mixed Amount (% by mass) |
| A | Amorphous Boron Nitride | 6.0 | 34.0 | Hexagonal Boron Nitride | 18.0 | 64.2 |
| B | Amorphous Boron Nitride | 0.8 | 34.0 | Hexagonal Boron Nitride | 4.5 | 64.2 |
| C | Amorphous Boron Nitride | 6.0 | 34.0 | Hexagonal Boron Nitride | 30.0 | 64.2 |
| D | Amorphous Boron Nitride | 6.0 | 34.0 | Hexagonal Boron Nitride | 18.0 | 64.2 |
| E | Amorphous Boron Nitride | 6.0 | 34.0 | Hexagonal Boron Nitride | 18.0 | 64.2 |
| F | Amorphous Boron Nitride | 6.0 | 34.0 | Hexagonal Boron Nitride | 18.0 | 64.2 |
| G | Amorphous Boron Nitride | 6.0 | 34.0 | Hexagonal Boron Nitride | 18.0 | 64.2 |
| H | Amorphous Boron Nitride | 6.0 | 33.7 | Silicon Nitride | 7.5 | 63.5 |
| I | Amorphous Boron Nitride | 6.0 | 33.7 | Aluminum Nitride | 7.5 | 63.5 |
| J | Amorphous Boron Nitride | 0.5 | 34.0 | Hexagonal Boron Nitride | 3.4 | 64.2 |
| K | Amorphous Boron Nitride | 6.0 | 34.0 | Hexagonal Boron Nitride | 40 | 64.2 |
| L | Amorphous Boron Nitride | 6.0 | 33.6 | Hexagonal Boron Nitride | 18.0 | 63.4 |
| M | Amorphous Boron Nitride | 6.0 | 33.6 | Hexagonal Boron Nitride | 18.0 | 63.4 |
| N | Amorphous Boron Nitride | 6.0 | 34.0 | Hexagonal Boron Nitride | 18.0 | 64.2 |
| O | Amorphous Boron Nitride | 6.0 | 34.0 | Hexagonal Boron Nitride | 18.0 | 64.2 |

| Non-oxide Ceramic Sintered Body | Sintering Aid (1) | | Sintering Ad (2) | | Sintering Aid (3) | |
|---|---|---|---|---|---|---|
| | Type | Mixed Amount (% by mass) | Type | Mixed Amount (% by mass) | Type | Mixed Amount (% by mass) |
| A | Calcium Carbonate | 0.6 | Boric Acid | 1.2 | — | — |
| B | Calcium Carbonate | 0.6 | Boric Acid | 1.2 | — | — |
| C | Calcium Carbonate | 0.6 | Boric Acid | 1.2 | — | — |
| D | Calcium Carbonate | 1.4 | Boric Acid | 0.4 | — | — |
| E | Sodium Carbonate | 0.4 | Boric Acid | 1.4 | — | — |
| F | Calcium Carbonate | 0.6 | Boric Acid | 1.2 | — | — |
| G | Calcium Carbonate | 0.6 | Boric Acid | 1.2 | — | — |
| H | Calcium Carbonate | 0.6 | Aluminum Oxide | 1.2 | Yttrium Oxide | 1.0 |
| I | Calcium Carbonate | 0.6 | Tricalcium Phosphate | 1.2 | Yttrium Oxide | 1.0 |
| J | Calcium Carbonate | 0.6 | Boric Acid | 1.2 | — | — |
| K | Calcium Carbonate | 0.6 | Boric Acid | 1.2 | — | — |
| L | Calcium Carbonate | 2.4 | Boric Acid | 0.6 | — | — |
| M | Sodium Carbonate | 0.6 | Boric Acid | 2.4 | — | — |
| N | Calcium Carbonate | 0.6 | Boric Acid | 1.2 | — | — |
| O | Calcium Carbonate | 0.6 | Boric Acid | 1.2 | — | — |

| Non-oxide Ceramic Sintered Body | Sintering Conditions | | | |
|---|---|---|---|---|
| | CIP Pressure (MPa) | Sintering Temperature (° C.) | Duration time (hr) | Nitrogen Flow Rate (L/min) |
| A | 75 | 2000 | 10 | 10 |
| B | 75 | 1950 | 8 | 10 |
| C | 75 | 2100 | 15 | 10 |
| D | 75 | 2000 | 10 | 10 |
| E | 75 | 2000 | 10 | 10 |
| F | 20 | 2000 | 10 | 10 |
| G | 100 | 2000 | 10 | 10 |
| H | 75 | 1850 | 10 | 10 |
| I | 75 | 1850 | 10 | 10 |
| J | 75 | 1900 | 6 | 10 |
| K | 75 | 2150 | 20 | 10 |
| L | 75 | 2000 | 10 | 10 |
| M | 75 | 2000 | 10 | 10 |
| N | 10 | 2000 | 10 | 10 |
| O | 120 | 2000 | 10 | 10 |

<Impregnation of Non-Oxide Ceramic Sintered Body with Thermosetting Resin Composition, Semi-Curing, Processing into Sheet>

The resulting non-oxide ceramic sintered bodies A to O were impregnated with thermosetting resin compositions. Eight thermosetting resin compositions AA to AH shown in Table 2 were used. Each thermosetting resin composition was prepared by stirring and mixing components as shown in Table 2 at 90° C. Twenty-six combinations of the non-oxide ceramic sintered bodies and the thermosetting resin compositions were prepared as shown in Table 3. Each non-oxide ceramic sintered body and each thermosetting resin composition were degassed in vacuum at a temperature of 145° C. and under a pressure of 15 Pa (abs) for 10 minutes using a vacuum heating impregnator ("G-555 AT-R" KYOSIN ENGINEERING CORPORATION), and the non-oxide ceramic sintered body was then immersed in the thermosetting resin composition for 10 minutes in the above apparatus under the above heating and vacuum conditions. Further, the non-oxide ceramic sintered body was impregnated with the thermosetting resin composition at a temperature of 145° C. and under a pressure of 3.5 MPa for 120 minutes using a heating-pressurizing impregnation apparatus ("HP-4030AA-H45" available from KYOSEI ENGINEERING CORPORATION) to form a composite of the non-oxide ceramic sintered body and the thermosetting resin composition. The composite was then heated under atmospheric pressure and at 160° C., and under the time conditions shown in Table 3, and the thermosetting resin composition was semi-cured (B stage) to obtain a ceramic-resin composite body.

(Proportion of Non-Oxide Ceramic Sintered Body and Proportion of Thermosetting Resin Composition)

The proportion of the non-oxide ceramic sintered body in the ceramic-resin composite was obtained from the bulk density and the true density of the non-oxide ceramic sintered body according to the method as described above. The bulk density was determined from the volume (which was calculated from the length of each edge) and the mass of the non-oxide ceramic sintered body, determined with a caliper ("CD 67-SPS" available from Mitutoyo Corporation) and an electronic balance ("MC-1000" available from by A & D Company. Limited), in accordance with the method as described above. The true density was determined from the volume and mass of the non-oxide ceramic sintered body, determined with a dry automatic densitometer ("AccuPyc II 1340" available from Micromeritics) in accordance with the method as described above. The results are shown in Tables 4 and 5.

(Exothermic Onset Temperature, Curing Rate and Melting Temperature of Thermosetting Resin Composition)

The exothermic onset temperature and the curing rate of the thermosetting resin composition in the ceramic-resin composite body were determined with a differential scanning calorimeter ("Model DSC-6100" available from Seiko Instruments Inc.) according to the method as described above. The results are shown in Tables 4 and 5.

(Number Average Molecular Weight)

The number average molecular weight of each thermosetting resin composition in each ceramic-resin composite body was determined with SEC according to the method as described above under the following conditions:

Dissolution Condition: 0.03 g of each measurement sample was dissolved in 10 ml of THF;
Filtration Conditions: filtrated through a membrane filter having pore size of 0.45 μm;
Deaerator: ERC-3315 available from ERC Corporation;
Pump: PU-980 available from JASCO Corporation;
Flow Rate: 1.0 ml/min;
Autosampler: AS-8020 available from TOSOH CORPORATION;
Column Oven: L-5030 available from Hitachi, Ltd.;
Set Temperature 40° C.;
Column Construction: two TSK guard columns MP (×L) 6.0 mm ID×4.0 cm available from Tosoh Corporation, and two TSK-GEL MULTIPORE HXL-M 7.8 mm ID×30.0 cm available from Tosoh Corporation (four columns in total);
Detector: RI, L-3350 available from Hitachi Ltd; and
Data Processing: SIC 480 data station.

The results are shown in Tables 4 and 5.

Each of twenty-six ceramic-resin composite bodies were processed into a sheet having a thickness of 320 μm using a multi-wire saw ("MWS-32N" available from Takatori Corporation) to obtain a thermally conductive insulating adhesive sheet.

TABLE 2

| Thermosetting Resin Composition | Substance Having Epoxy Group | | | Substance Having Cyanate Group | | |
|---|---|---|---|---|---|---|
| | Substance Name | Model # (Manufacturer) | Mixing Ratio (wt %) | Substance Name | Model # (Manufacturer) | Mixing Ratio (wt %) |
| AA | Bisphenol F Type Epoxy Resin | JER807 (from Mitsubishi Chemical) | 12.10 | Novolak Type Cyanate Resin | PT-30 (from Lonza) | 72.00 |
| AB | Bisphenol F Type Epoxy Resin | JER807 (from Mitsubishi Chemical) | 12.09 | Novolak Type Cyanate Resin | PT-30 (from Lonza) | 71.93 |
| AC | Bisphenol A Type Epoxy Resin | EPICLON4050 (from DIC) | 20.00 | Novolak Type Cyanate Resin | PT-60 (from Lonza) | 72.00 |
| AD | — | — | — | Novolak Type Cyanate Resin | PT-15 (from Lonza) | 90.00 |
| AE | — | — | — | Novolak Type Cyanate Resin | PT-30 (from Lonza) | 99.90 |
| AF | Bisphenol F Type Epoxy Resin | JER807 (from Mitsubishi Chemical) | 12.09 | Novolak Type Cyanate Resin | PT-30 (from Lonza) | 71.93 |
| AG | Bisphenol A Type Epoxy Resin | EPICLON7050 (from DIC) | 20.00 | Novolak Type Cyanate Resin | PT-60 (from Lonza) | 72.00 |
| AH | — | — | — | Novolak Type Cyanate Resin | PT-15 (from Lonza) | 90.00 |

TABLE 2-continued

| Thermosetting Resin Composition | Substance Having Hydroxyl Group | | | Substance Having Maleimide Group | | |
|---|---|---|---|---|---|---|
| | Substance Name | Model # (Manufacturer) | Mixing Ratio (wt %) | Substance Name | Model # (Manufacturer) | Mixing Ratio (wt %) |
| AA | Phenol Novolak Resin | TD-2131 (from DIC) | 7.90 | bis(3-ethyl-5-methyl-4-maleimido-phenyl)-methane | BMI-70 (from K-I Chemical Industry) | 8.00 |
| AB | Phenol Novolak Resin | TD-2131 (from DIC) | 7.89 | bis(3-ethyl-5-methyl-4-maleimido-phenyl)-methane | BMI-70 (from K-I Chemical Industry) | 7.99 |
| AC | — | — | — | bis(3-ethyl-5-methyl-4-maleimido-phenyl)-methane | BMI-70 (from K-I Chemical Industry) | 8.00 |
| AD | — | — | — | bis(3-ethyl-5-methyl-4-maleimido-phenyl)-methane | BMI-70 (from K-I Chemical Industry) | 10.00 |
| AE | — | — | — | — | — | — |
| AF | Phenol Novolak Resin | TD-2131 (from DIC) | 7.89 | bis(3-ethyl-5-methyl-4-maleimido-phenyl)-methane | BMI-70 (from K-I Chemical Industry) | 7.99 |
| AG | — | — | — | 2,2'-bis[4-(4-maleimido-phenoxy)-phenyl]propane | BMI-80 (from K-I Chemical Industry) | 8.00 |
| AH | — | — | — | 4,4'-diphenyl-methane bismaleimide | BMI (from K-I Chemical Industry) | 10.00 |

| Thermosetting Resin Composition | Curing Accelerator | | |
|---|---|---|---|
| | Substance Name | Model # (Manufacturer) | Mixing Ratio (wt%) |
| AA | — | — | — |
| AB | Triphenylphosphine | TPP (from HOKKO CHEMICAL INDUSTRY) | 0.10 |
| AC | — | — | — |
| AD | — | — | — |
| AE | Triphenylphosphine | TPP (from HOKKO CHEMICAL INDUSTRY) | 0.10 |
| AF | Acetylacetone Copper (II) | (from Showa Chemical Industry) | 0.10 |
| AG | — | — | — |
| AH | — | — | — |

TABLE 3

| | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 |
|---|---|---|---|---|---|---|---|---|---|---|---|---|---|
| Non-oxide Ceramic Sintered Body | A | B | C | D | E | F | G | A | A | A | A | A | H |
| Thermosetting Resin Composition | AA | AA | AA | AA | AA | AA | AA | AB | AC | AD | AD | AC | AA |
| Ceramic-Resin Composite Body | AAA | BAA | CAA | DAA | EAA | FAA | GAA | AAB | AAC | AAD | AAD2 | AAC2 | HAA |

TABLE 3-continued

| | | | | | | | | | | | | | |
|---|---|---|---|---|---|---|---|---|---|---|---|---|---|
| Semi-curing Time of Ceramic-Resin Composite Body (hr) | 12 | 12 | 12 | 12 | 12 | 12 | 12 | 12 | 6 | 21 | 12 | 12 | 12 |

| | Ex. 14 | Ex. 15 | Comp. 1 | Comp. 2 | Comp. 3 | Comp. 4 | Comp. 5 | Comp. 6 | Comp. 7 | Comp. 8 | Comp. 9 | Comp. 10 | Comp. 11 |
|---|---|---|---|---|---|---|---|---|---|---|---|---|---|
| Non-oxide Ceramic Sintered Body | I | A | J | K | L | M | N | O | A | A | A | A | A |
| Thermosetting Resin Composition | AA | AE | AA | AA | AA | AA | AA | AA | AF | AG | AH | AH | AG |
| Ceramic-Resin Composite Body | IAA | AAE | JAA | KAA | LAA | MAA | NAA | OAA | AAF | AAG | AAH | AAH2 | AAG2 |
| Semi-curing Time of Ceramic-Resin Composite Body (hr) | 12 | 12 | 12 | 12 | 12 | 12 | 12 | 12 | 12 | 4 | 27 | 12 | 12 |

(Measurement of Thickness and Standard Deviation of Thickness of Thermally Conductive Insulating Adhesive Sheet)

The thickness of each thermally conductive insulating adhesive sheet was measured in accordance with JIS K7130: 1999, Method A. The measured thermally conductive insulating adhesive sheet had a size of width×length=150 mm×150 mm, and a total ten sheets were subjected to the measurement at ten positions per sheet for each type. The evaluation results of the thickness and the standard deviation of the thickness of each of the resulting thermally conductive insulating adhesive sheets are shown in Tables 4 and 5.

(Elastic Modulus of Non-Oxide Ceramic Sintered Body)

The elastic modulus of each non-oxide ceramic sintered body was determined from a load-strain curve determined by using Autograph ("AG-300 kNX" available from Shimadzu Corporation) (See Appendix FIG. 5 in JIS R1602: 1995), according to the static elastic modulus test method defined in JIS R1602: 1995. The results are shown in Tables 4 and 5.

(Strength of Non-Oxide Ceramic Sintered Body)

The strength of each non-oxide ceramic sintered body was determined from the maximum load when the sample was broken, determined by using Autograph ("AG-300 kNX" available from Shimadzu Corporation) in accordance with a three-point bending method defined in JIS R1601: 2008 (see JIS R 1601: 2008, Section 7.1). The results are shown in Tables 4 and 5.

<Production of Laminate>

Onto both surfaces of each thermally conductive insulating adhesive sheet, a 1.0 mm thick copper plate having the same external size as that of the thermally conductive insulating adhesive sheet was press-bonded under a pressure of 5 MPa (G) and at a heating temperature of 240° C. for a heating time of 5 hours using a press machine ("MHPC-VF-350-350-1-45" available from MEIKI CO., LTD.) to obtain each laminate in which metal plates (copper) each having the surface roughness shown in Tables 4 and 5 were bonded to both surfaces of the thermally conductive insulating adhesive sheet. The surface roughness (ten-point average roughness Rz) of the metal plate was determined by a contact type surface roughness measuring instrument ("SEF 580-G 18" available from Kosaka Laboratory Ltd.) according to the method as described above.

In this process, the thermosetting resin composition cures to the C stage. It should be noted that in Comparative Example 9, the curing rate of the thermosetting resin composition was 62.6%, the thermosetting resin composition did not melt during press bonding, and thus the copper plate did not adhere. Therefore, in Comparative Example 9, a thermosetting resin composition obtained by stirring 100 parts by mass of an epoxy resin ("JER 828" available from Mitsubishi Chemical Corporation), 60 parts by mass of a curing agent ("VH-4150" available from DIC Corporation), 3 parts by mass of a curing accelerator ("TPP" available from HOKKU CHEMICAL INDUSTRY, CO., LTD.) and 500 parts by mass of ceramics powder ("AKP-15" available from Sumitomo Chemical Co., Ltd.) for 15 minutes in a planetary mixer was applied as an adhesive layer to both surfaces of a thermally conductive insulating adhesive sheet to have a thickness of 5 μm, and a copper plate was the bonded thereto.

(Evaluation of Dielectric Breakdown Strength)

On one side of the laminate, an etching resist was screen-printed into a circular circuit pattern having a diameter of 20 mm (a solid pattern filled in a circle), and on the other side, an etching resist was screen-printed into a solid pattern. After curing the etching resists with ultraviolet rays, the metal plate was etched with a solution of cupric chloride to form a circular copper circuit having a diameter of 20 mm on one side of the laminate. The resists were then peeled off with an alkali solution, and then subjected to electroless Ni—P plating having a thickness of 2 μm to produce a circuit board for evaluation. The circuit board was immersed in insulating oil, and AC voltage was applied between the copper circuit and the copper plate at room temperature, and dielectric breakdown strength was determined in accordance with JIS C2110-1: 2010. As a measuring instrument, "TOS-8700" (available from KIKUSUI ELECTRONICS CORP.) was used. The evaluation results of the dielectric breakdown strength for each of the resulting circuit boards are shown in Tables 4 and 5.

(Thermal Conductivity)

The thermal conductivity to be evaluated in the present invention is a thermal conductivity of the insulating layer (the thermally conductive insulating adhesive sheet in which the thermosetting resin composition has almost cured and has been in the C stage state). The thermal conductivity in this case is not merely the thermal conductivity of the insulating layer alone, but it is the thermal conductivity including interfacial thermal resistance between the insulating layer and the copper plate (copper circuit). The measurement was carried out in accordance with JIS H8453: 2010 using the above laminate in which the metal plates (copper) were adhered to both surfaces of the thermally conductive insulating adhesive sheet, as a measuring sample. As a measuring instrument, "TC-1200 RH" (available from ADVANCE RIKO, Inc.) was used. The evaluation results of the resulting thermal conductivity are shown in Tables 4 and 5.

(Tensile Shear Adhesive Strength)

Copper plates each having a size of width×length×thickness=25 mm×100 mm×1.0 mm were laminated on both sides of a thermally conductive insulating adhesive sheet having a size of width×length×thickness=25 mm×12.5 mm×320 μm (for the sample size and lamination method, see JIS K 6850: 1999 Appendix FIG. 1), and press-bonded under a pressure of 5 MPa and at a heating temperature of 240° C. for a heating time of 5 hours using a vacuum heat press machine to obtain a sample for shear adhesive strength measurement. The measurement was performed according to JIS K6850: 1999 under conditions of a measurement temperature of 25° C. and a crosshead speed of 5.0 mm/min using an autograph ("AG-100 kN" available from Shimadzu Corporation) as a measuring device. The evaluation results of the resulting tensile shear adhesive strength are shown in Tables 4 and 5.

TABLE 4

| Items | | Ex 1 | Ex 2 | Ex 3 | Ex 4 | Ex 5 | Ex 6 | Ex 7 | Ex 8 |
|---|---|---|---|---|---|---|---|---|---|
| Average Pore Diameter of Non-Oxide Ceramic Sintered Body | (μm) | 1.2 | 0.9 | 1.5 | 1.0 | 1.7 | 1.5 | 0.8 | 1.2 |
| Ceramic-Resin Composite Body | | AAA | BAA | CAA | DAA | EAA | FAA | GAA | AAB |
| Average Major Diameter of Non-Oxide Ceramic Primary Particles | (μm) | 32.2 | 3.7 | 57.1 | 30.2 | 33.7 | 31.9 | 32.6 | 32.1 |
| Aspect Ratio of Non-Oxide Ceramic Primary Particles | (—) | 13.5 | 12.8 | 11.9 | 5.8 | 27.9 | 12.9 | 13.1 | 13.2 |
| Proportion of Non-Oxide Ceramic Sintered Body | (Vol. %) | 58.0 | 58.9 | 57.6 | 57.1 | 59.8 | 36.9 | 68.7 | 59.3 |
| Exothermic Onset Temperature of Thermosetting Resin Composition | (° C.) | 215 | 214 | 218 | 214 | 213 | 215 | 210 | 185 |
| Curing Rate of Thermosetting Resin Composition | (%) | 18.3 | 18.1 | 17.4 | 17.9 | 19.2 | 18.7 | 19.0 | 17.9 |
| Number Average Molecular Weight of Thermosetting Resin Composition | (—) | 1050 | 1037 | 1123 | 987 | 1213 | 1135 | 956 | 1097 |
| Proportion of Thermosetting Resin Composition | (Vol. %) | 42.0 | 41.1 | 42.4 | 42.9 | 40.2 | 63.1 | 31.3 | 40.7 |
| Melting Temperature of Thermosetting Resin Composition | (° C.) | 101.2 | 98.7 | 99.3 | 97.9 | 103.5 | 102.6 | 98.6 | 100.3 |
| Thickness of Thermally Conductive Insulating Adhesive Sheet | (μm) | 320.3 | 321.1 | 319.4 | 318.7 | 321.3 | 320.8 | 320.2 | 319.8 |
| Standard Deviation of Thickness of Thermally Conductive Insulating Adhesive Sheet | (μm) | 3.1 | 3.3 | 2.5 | 2.9 | 3.0 | 3.2 | 3.1 | 3.7 |
| Elastic Modulus of Non-Oxide Ceramic Sintered Body (Measurement Temperature: 25° C.) | (GPa) | 9.2 | 11.2 | 8.7 | 10.9 | 9.0 | 9.0 | 9.3 | 9.1 |
| Strength of Non-Oxide Ceramic Sintered Body (Measurement Temperature: 25° C.) | (GPa) | 19.7 | 21.8 | 17.8 | 21.2 | 17.7 | 18.5 | 20.1 | 19.9 |
| Surface Roughness (Rz) of Metal Sheet on Bonded Surface to Insulating layer | (μm) | 6.2 | 6.1 | 6.5 | 7.1 | 5.6 | 6.3 | 6.5 | 7.0 |
| Dielectric Breakdown Strength | (kV/mm) | 42.1 | 43.3 | 42.2 | 41.9 | 42.6 | 43.8 | 42.0 | 38.9 |
| Thermal Conductivity | (W/(m·K)) | 101.2 | 93.6 | 95.8 | 92.3 | 98.7 | 89.4 | 93.8 | 99.6 |
| Tensile Shear Adhesve Strength | (MPa) | 9.3 | 8.9 | 8.2 | 8.3 | 7.6 | 10.3 | 7.5 | 8.8 |

| Items | | Ex. 9 | Ex. 10 | Ex. 11 | Ex. 12 | Ex. 13 | Ex. 14 | Ex. 15 |
|---|---|---|---|---|---|---|---|---|
| Average Pore Diameter of Non-Oxide Ceramic Sintered Body | (μm) | 1.2 | 1.2 | 1.2 | 1.2 | 0.8 | 0.7 | 1.2 |
| Ceramic-Resin Composite Body | | AAC | AAD | AAD2 | AAC2 | HAA | IAA | AAE |
| Average Major Diameter of Non-Oxide Ceramic Primary Particles | (μm) | 31.0 | 32.8 | 32.3 | 33.6 | 21.3 | 19.8 | 21.9 |
| Aspect Ratio of Non-Oxide Ceramic Primary Particles | (—) | 12.8 | 13.4 | 12.7 | 13.7 | 9.8 | 8.7 | 13.2 |
| Proportion of Non-Oxide Ceramic Sintered Body | (Vol. %) | 57.7 | 59.1 | 58.6 | 57.4 | 59.1 | 60.2 | 58.9 |
| Exothermic Onset Temperature of Thermosetting Resin Composition | (° C.) | 201 | 205 | 215 | 218 | 209 | 212 | 201 |
| Curing Rate of Thermosetting Resin Composition | (%) | 6.3 | 58.3 | 20.1 | 21.1 | 19.9 | 20.5 | 21.0 |
| Number Average Molecular Weight of Thermosetting Resin Composition | (—) | 939 | 1231 | 468 | 4710 | 1063 | 1089 | 993 |
| Proportion of Thermosetting Resin Composition | (Vol. %) | 42.3 | 40.9 | 41.4 | 42.6 | 40.9 | 39.8 | 41.1 |
| Melting Temperature of Thermosetting Resin Composition | (° C.) | 93.4 | 105.8 | 96.3 | 105.6 | 100.2 | 102.3 | 99.4 |
| Thickness of Thermally Conductive Insulating Adhesive Sheet | (μm) | 322.3 | 318.9 | 319.1 | 321.5 | 320.1 | 320.7 | 106.7 |
| Standard Deviation of Thickness of Thermally Conductive Insulating Adhesive Sheet | (μm) | 4.2 | 2.8 | 4.9 | 3.0 | 2.7 | 2.3 | 4.2 |
| Elastic Modulus of Non-Oxide Ceramic Sintered Body (measurement temperature: 25° C.) | (GPa) | 9.5 | 9.0 | 8.7 | 8.6 | 10.7 | 10.5 | 10.1 |
| Strength of Non-Oxide Ceramic Sintered Body (Measurement Temperature: 25° C.) | (GPa) | 19.6 | 19.5 | 19.8 | 19.9 | 23.1 | 22.4 | 18.9 |
| Surface Roughness (Rz) of Metal Sheet on Bonded Surface to Insulating layer | (μm) | 6.6 | 6.3 | 7.1 | 6.0 | 5.9 | 6.2 | 7.0 |
| Dielectric Breakdown Strength | (kV/mm) | 38.7 | 41.9 | 39.1 | 41.2 | 41.7 | 42.7 | 35.5 |
| Thermal ConductivIty | (W/(m·K)) | 88.4 | 87.9 | 88.3 | 91.3 | 90.3 | 112.3 | 81.2 |
| Tensile Shear Adhesive Strength | (MPa) | 9.3 | 7.1 | 8.6 | 7.6 | 11.2 | 10.9 | 6.8 |

TABLE 5

| Items | | Comp. 1 | Comp. 2 | Comp. 3 | Comp. 4 | Comp. 5 | Comp. 6 | Comp. 7 |
|---|---|---|---|---|---|---|---|---|
| Average Pore Diameter of Non-Oxide Ceramic Sintered Body | (μm) | 0.7 | 1.6 | 0.8 | 1.5 | 1.9 | 0.6 | 1.2 |
| Ceramic-Resin Composite Body | | JAA | KAA | LAA | MAA | NAA | OAA | AAF |
| Average Major Diameter of Non-Oxide Ceramic Primary Particles | (μm) | 2.8 | 63.2 | 30.5 | 33.5 | 31.7 | 32.4 | 32.5 |
| Aspect Ratio of Non-Oxide Ceramic Primary Particles | (—) | 12.7 | 12.1 | 4.7 | 31.3 | 12.7 | 13.4 | 12.9 |
| Proportion of Non-Oxide Ceramic Sintered Body | (Vol. %) | 58.2 | 57.8 | 57.2 | 60.3 | 34.2 | 72.1 | 59.3 |
| Exothermic Onset Temperature of Thermosetting Resin Composition | (° C.) | 217 | 211 | 215 | 214 | 210 | 214 | 171 |
| Curing Rate of Thermosetting Resin Composition | (%) | 19.7 | 18.9 | 19.1 | 18.6 | 20.1 | 19.5 | 17.8 |
| Number Average Molecular Weight of Thermosetting Resin Composition | (—) | 1032 | 1128 | 996 | 1217 | 1121 | 987 | 1057 |
| Proportion of Thermosetting Resin Composition | (Vol. %) | 41.8 | 42.2 | 42.8 | 39.7 | 65.8 | 27.9 | 40.7 |
| Melting Temperature of Thermosetting Resin Composition | (° C.) | 98.9 | 100.3 | 98.6 | 101.3 | 102.9 | 99.8 | 102.3 |
| Thickness of Thermally Conductive Insulating Adhesive Sheet | (μm) | 322.1 | 320.3 | 319.8 | 320.4 | 318.5 | 317.1 | 322.1 |
| Standard Deviation of Thickness of Thermally Conductive Insulating Adhesive Sheet | (μm) | 3.2 | 2.7 | 3.0 | 3.0 | 3.3 | 3.2 | 3.6 |
| Elastic Modulus of Non-Oxide Ceramic Sintered Body (Measurement Temperature: 25° C. | (GPa) | 37.2 | 8.5 | 35.6 | 8.6 | 8.8 | 12.3 | 9.0 |
| Strength of Non-Oxide Ceramic Sintered Body (Measurement Temperature: 25° C.) | (GPa) | 21.0 | 4.2 | 22.1 | 3.9 | 18.9 | 20.1 | 19.8 |
| Surface Roughness (Rz) of Metal Sheet on Bonded Surface to Insulating layer | (μm) | 6.3 | 5.8 | 6.5 | 7.0 | 6.5 | 6.7 | 6.7 |
| Dielectric Breakdown Strength | (kV/mm) | 31.0 | 28.4 | 32.1 | 27.6 | 32.8 | 30.2 | 9.8 |
| Thermal Conductivity | (W/(m · K)) | 12.3 | 92.3 | 11.3 | 89.5 | 21.9 | 39.8 | 95.4 |
| Tensile Shear Adhesive Strength | (MPa) | 1.9 | 1.5 | 2.0 | 1.7 | 9.6 | 1.2 | 5.4 |

| Items | | Comp. 8 | Comp. 9 | Comp. 10 | Comp. 11 |
|---|---|---|---|---|---|
| Average Pore Diameter of Non-Oxide Ceramic Sintered Body | (μm) | 1.2 | 1.2 | 1.2 | 1.2 |
| Ceramic-Resin Composite Body | | AAG | AAH | AAH2 | AAG2 |
| Average Major Diameter of Non-Oxide Ceramic Primary Particles | (μm) | 32.4 | 32.1 | 32.5 | 33.1 |
| Aspect Ratio of Non-Oxide Ceramic Primary Particles | (—) | 13.3 | 13.5 | 12.6 | 13.5 |
| Proportion of Non-Oxide Ceramic Sintered Body | (Vol.%) | 59.0 | 59.5 | 58.5 | 57.7 |
| Exothermic Onset Temperature of Thermosetting Resin Composition | (° C.) | 211 | 204 | 217 | 218 |
| Curing Rate of Thermosetting Resin Composition | (%) | 4.2 | 62.6 | 18.1 | 21.1 |
| Number Average Molecular Weight of Thermosetting Resin Composition | (—) | 1004 | 1154 | 437 | 4932 |
| Proportion of Thermosetting Resin Composition | (Vol. %) | 41.0 | 40.5 | 41.5 | 42.3 |
| Melting Temperature of Thermosetting Resin Composition | (° C.) | 100.4 | 101.5 | 51.2 | 106.3 |
| Thickness of Thermally Conductive Insulating Adhesive Sheet | (μm) | 319.4 | 320.1 | 320.1 | 320.4 |
| Standard Deviation of Thickness of Thermally Conductive Insulating Adhesive Sheet | (μm) | 18.9 | 3.3 | 17.2 | 2.8 |
| Elastic Modulus of Non-Oxide Ceramic Sintered Body (Measurement Temperature: 25° C. | (GPa) | 9.5 | 9.0 | 9.5 | 9.2 |
| Strength of Non-Oxide Ceramic Sintered Body (Measurement Temperature: 25° C.) | (GPa) | 18.7 | 19.6 | 20.3 | 19.5 |
| Surface Roughness (Rz) of Metal Sheet on Bonded Surface to Insulating layer | (Mm) | 7.2 | 6.9 | 6.3 | 6.7 |
| Dielectric Breakdown Strength | (kV/mm) | 10.2 | 31.9 | 11.2 | 32.9 |
| Thermal Conductivity | (W/(m · K)) | 18.5 | 19.1 | 23.6 | 18.7 |
| Tensile Shear Adhesive Strength | (MPa) | 5.9 | 6.1 | 8.4 | 0.9 |

As is clear from comparison of Examples with Comparative Examples, the circuit board using the thermally conductive insulating adhesive sheet according to the present invention possesses heat dissipation properties, insulation properties and adhesiveness with higher levels.

In Comparative Example 1, the average major diameter of the non-oxide ceramic primary particles was too short, so that the elastic modulus of the non-oxide ceramic sintered body was increased, and the thermal conductivity and the tensile shear adhesive strength were decreased as compared with Examples.

In Comparative Example 2, the average major diameter of the non-oxide ceramic primary particles was too long, so that the strength of the non-oxide ceramic sintered body was decreased and the tensile shear adhesive strength was decreased as compared with Examples.

In Comparative Example 3, the aspect ratio of the non-oxide ceramic primary particles was too low, so that the elastic modulus of the non-oxide ceramic sintered body was increased and the thermal conductivity was decreased as compared with Examples.

In Comparative Example 4, the aspect ratio of the non-oxide ceramic primary particles was too high, so that the strength of the non-oxide ceramic sintered body was decreased and the tensile shear adhesive strength was decreased as compared with Examples.

In Comparative Example 5, the proportion of the non-oxide ceramic sintered body was too low, and conversely, the proportion of the thermosetting resin composition having low thermal conductivity was increased, so that the thermal conductivity was decreased as compared with Example.

In Comparative Example 6, the proportion of the non-oxide ceramic sintered body was too high, so that when the copper plate was bonded to the thermally conductive insulating adhesive sheet by heating and pressurzing, the thermosetting resin composition was difficult to infiltrate the irregularities on the surface of the copper plate, and the tensile shear adhesive strength and the thermal conductivity were decreased as compared with Examples.

In Comparative Example 7, the exothermic onset temperature of the thermosetting resin composition was too low. As a result, during the vacuum impregnation and pressure impregnation, the curing reaction of the thermosetting resin composition proceeded when heated to decrease the viscosity of the thermosetting resin composition, and the viscosity of the thermosetting resin composition was increased, so that the inside of each pore of the non-oxide ceramic sintered body could not be impregnated with the thermosetting resin composition. Therefore, defects (pores) were present in the insulating layer of the circuit board, and the dielectric breakdown strength was decreased.

In Comparative Example 8, the curing rate of the thermosetting resin composition was too low. As a result, the thermosetting resin composition in the uncured state melted due to the heat generated when the ceramic-resin composite was cut into the plate-shaped thermally conductive insulating adhesive sheet, and variations of the thickness were generated. Further, the ceramic-resin composite could not withstand the impact of cutting and cracks occurred, and the dielectric breakdown strength of the circuit board was decreased as compared with Examples. Furthermore, the adhesive (resin) layer having low thermal conductivity was formed on the irregularities on the surface of the copper plate and the thermal conductivity was decreased as compared with Examples.

In Comparative Example 9, the curing rate of the thermosetting resin composition was too high. The thermosetting resin composition did not melt when bonding the copper plate to the thermally conductive insulating adhesive sheet by heating and pressurizing, so that the thermosetting resin composition could not adhere to the copper plate and the circuit board could not be manufactured. Therefore, when bonding the copper plate to the thermally conductive insulating adhesive sheet, an adhesive layer having low thermal conductivity (the thermosetting resin composition or the dispersant of ceramic powder in the thermosetting resin composition) was used to manufacture the circuit board, so that the heat dissipation of the circuit board was deteriorated.

In Comparative Example 10, the number average molecular weight of the thermosetting resin composition was too low. As a result, the thermosetting resin composition melted due to the heat generated when the ceramic-resin composite was cut into the plate-shaped thermally conductive insulating adhesive sheet, causing variations in the thickness. Further, the ceramic-resin composite could not withstand the impact of cutting and cracking occurred. Furthermore, the thermosetting resin composition layer having low thermal conductivity was formed on the irregularities on the surface of the copper plate, and the thermal conductivity was decreased.

In Comparative Example 11, the number average molecular weight of the thermosetting resin composition was too high. As a result, when bonding the copper plate to the thermally conductive insulating adhesive sheet by heating and pressurizing, the melt viscosity of the thermosetting resin composition was high, so that the adhesive strength to the copper plate was decreased. Further, when bonding the copper plate to the thermally conductive insulating adhesive sheet by heating and pressurizing, it was difficult for the composition to infiltrate the irregularities on the surface of the copper plate, so that the thermal conductivity was decreased.

INDUSTRIAL APPLICABILITY

The thermally conductive insulating adhesive sheet according to the present invention can be used as a circuit board for power semiconductor modules or LED light emitting devices or multilayer circuit boards. Further, the thermally conductive insulating adhesive sheet according to the present invention can be used for in-car power modules.

What is claimed is:

1. A ceramic-resin composite body comprising:
from 35% by volume to 70% by volume of a sintered body having a monolithic structure in which non-oxide ceramic primary particles having an average major diameter of from 3 μm to 60 μm and an aspect ratio of from 5 to 30 are three-dimensionally continuous; and
from 65% by volume to 30% by volume of a thermosetting resin composition having an exothermic onset temperature of 180° C. or more and a curing rate of from 5% to 60% as determined with a differential scanning calorimeter, and having a number average molecular weight of from 450 to 4800,
wherein the sintered body is impregnated with the thermosetting resin composition.

2. The ceramic-resin composite body according to claim 1, wherein the non-oxide ceramic sintered body comprises one or a combination of two or more selected from the group consisting of boron nitride, aluminum nitride, and silicon nitride.

3. The ceramic-resin composite body according to claim 1, wherein the thermosetting resin composition has a melting temperature of 70° C. or more.

4. The ceramic-resin composite body according to claim 1, wherein the thermosetting resin composition comprises a combination of one or both of a substance having at least one epoxy group and a substance having at least one cyanate group with one or both of a substance having at least one hydroxyl group and a substance having at least one maleimide group.

5. A thermally conductive insulating adhesive sheet obtained by processing the ceramic-resin composite according to claim 1.

6. A circuit board comprising a metal circuit laminated on a metal plate via an insulating layer, wherein the thermally conductive insulating adhesive sheet according to claim 5 is used for the insulating layer.

7. A multilayer circuit board comprising two or more layers of insulating layers and metal circuits alternately laminated on a metal plate, wherein the thermally conductive insulating adhesive sheet according to claim 5 is used for the insulating layers.

8. An in-car power module structure comprising two or more electronic members bonded via the thermally conductive insulating adhesive sheet according to claim 5.

9. A light emitting device comprising: the circuit board according to claim 6; and at least one LED provided on a metal circuit.

10. A light emitting device comprising: the multilayer circuit board according to claim 7; and at least one LED provided on a metal circuit.

* * * * *